United States Patent [19]

Lewis

[11] Patent Number: 4,705,742

[45] Date of Patent: Nov. 10, 1987

[54] PROCESSLESS MULTICOLOR IMAGING

[75] Inventor: David F. Lewis, Monroe, Conn.

[73] Assignee: GAF Corporation, Wayne, N.J.

[21] Appl. No.: 778,938

[22] Filed: Sep. 23, 1985

[51] Int. Cl.[4] ................................................. G03C 7/00
[52] U.S. Cl. .................................... 430/333; 430/296; 430/967; 430/338
[58] Field of Search ............... 430/332, 333, 374, 445, 430/346, 296, 338, 967

[56] References Cited

U.S. PATENT DOCUMENTS

| | | | |
|---|---|---|---|
| 3,501,297 | 3/1970 | Cremeans | 430/332 |
| 3,501,302 | 3/1970 | Foltz | 430/332 |
| 3,501,303 | 3/1970 | Foltz et al. | 430/332 |
| 4,542,084 | 9/1985 | Watanabe et al. | 430/42 |

Primary Examiner—Won H. Louie
Attorney, Agent, or Firm—Marilyn J. Maue; Joshua J. Ward

[57] ABSTRACT

An image receptive film comprising a surface layer containing a photosensitive polyacetylenic compound having at least two acetylenic linkages in a conjugated system is subjected to a plurality of radiant energy exposures each limited to a divisible portion of the image to be transmitted and at least each of 2 exposures effected at a distinctive dosage level, to develop exposed discrete portions in its respective divided portion to a characteristic color distinguishable from that developed in the surface layer by any other exposure at a different dosage level.

16 Claims, No Drawings

PROCESSLESS MULTICOLOR IMAGING

In one aspect the present invention relates to multicolor imaging of photosensitive polyacetylene crystals suspended in a binder as a surface layer on a base film. In another aspect the invention relates to direct multicolor imaging with a polyacetylenic two dimensional ordered phase film in an electron beam imaging process.

PRIOR ART

Color imaging of polyacetylene crystals fixedly positioned on a base film is known. Generally the polyacetylene coated base film or recording medium is exposed to a source of radiant energy, such as photon or particle radiation, to polymerize the exposed portions of the crystals and impart a particular color distinguishable from the unexposed polyacetylene crystals. However, in these cases the shade or hue developed is essentially the same over the entire transmitted image and is effected at a predetermined exposure necessary to attain the minimum and maximum color density. U.S. Pat. No. 3,501,302 discloses that the initial color of exposed polyacetylenic compounds may be permanently altered by heating or by the action of solvent or solvent vapor. The particular temperature or solvents causing these changes to occur are characteristic of the particular diacetylene material and the color change is apparently related to a change in the conformation of atoms within the chromophore backbone of the dye polymer molecule. However, not all photosensitive diacetylenic dye polymer materials undergo this heat or solvent induced permanent color change and in those cases where permanency is not achieved, the altered color is reversible. In either case, the net result of such unprocessed film and heat or solvent processed films is a unicolor image displayed on an unexposed background.

Notwithstanding this ability to alter the initial color of the transmitted image; and even to possibly adapt these methods to multicolor imaging in portions of the overall pattern, the disadvantage and unfeasability of imposing a heating or solvent treating step, that would be required between separate radiation exposures to obtain the multicolored portions of the pattern, is that these procedures usually require the removal and replacement of the imaging material in a high vacuum environment between exposures.

Accordingly, it is an object of the present invention to overcome the above disadvantages and inefficiencies.

Another object of this invention is to provide a procedure for obtaining multicolor images directly from a radiant energy source without the need for subsequent developing or other process steps.

Another object is to provide a multicolor imaging process which avoids removal of the image receptive element from the vacuum environment of the radiant energy source.

These and other objects of the invention will become apparent from the following description and disclosure.

THE INVENTION

In accordance with the present invention, the surface layer of a photosensitive polyacetylenic compound disposed on a conductive substrate as an image receptive film, is subjected to separate exposures of radiant energy at distinctive levels of dosage, each of which develops a distinguishable color in an exposed area of the surface layer. Each exposure at a different dosage is restricted to the transmission of a limited divisible portion of the overall image to be transmitted from a photon or particulate energy source. More specifically a low dosage level exposure with photon or particulate energy, e.g between about $10^{-10}$ coulomb/cm² (C/cm²) and about $10^{-5}$ C/cm², preferably between about $10^{-9}$ C/cm² and about $10^{-6}$ C/cm², preferably between about 1 KeV and about 1 MeV, preferably between about 10 KeV and about 30 KeV, and between about $10^4$ ergs/cm² and about $10^7$ ergs/cm², preferably between about $10^5$ ergs/cm² and about $10^6$ ergs/cm² for photon energy at about 254 nm wavelength, develops a color, most often a blue or magenta color in the exposed portions of the polyacetylenic crystals. Another high dosage level exposure is effected with a particulate radiation source which transmits another portion of the image to be transcribed at a level of between about $10^{-5}$ C/cm² and about $10^{-1}$ C/cm², preferably between about $10^{-4}$ C/cm² and about $10^{-2}$ C/cm², for electrons between about 1 KeV and about 1 MeV, preferably between about 10 KeV and about 30 KeV in order to develop a color distinguishable from that of the first exposure, usually red, orange or yellow, on the exposed portions of the polyacetylenic layer in said image receptive surface layer. It is particularly preferred that at least the higher dosage level exposure be effected by energy transmitted from an electron beam; although both exposures can be effected with the same particulate energy source if desired.

In connection with the most preferred method of operation, an image receptive layer containing crystals of pentacosa-10,12-diynoic acid dispersed in a gelatin binder are first imaged with a 10-30 KeV electron beam at a dosage of between about $10^{-9}$ and about $10^{-6}$ coulomb/cm² (C/cm²) to produce a blue image of a portion of the overall image to be transcribed. The blue imaged film is then exposed with the same electron beam at an exposure dosage of between about $10^{-3}$ and about $10^{-5}$ C/cm² to transmit the remaining portion of the overall image on the portions of the diacetylenic crystals subjected to said second exposure to produce a yellow image.

More broadly, beam energies between about 10 and about 50 KeV can be employed and the exposures at a low dosage level and high dosage level can be reversed if desired. The distinguishable colors developed, of course, may vary with the polyacetylenic compound selected. For example, low dosage exposures, may develop a magenta, brown or black color rather than blue mentioned above. Similarly, the high dosage exposure may develop a distinguishable orange or red color, in place of the yellow hue. The specific colors depend upon the particular characteristic of the polyacetylene and the dosage intensity. However, in all cases, the high and low dosage level exposures are each separately restricted to a divisible portion of the entire image to be transcribed.

The radiant energy contemplated as the energy source in the present invention includes energy generated from an electron beam such as developed by cathode ray guns, ion beams, uncharged particle beams such as molecular beams, gamma rays and X-rays used in radiography, beta rays, electron corona discharge, ultra-violet and actinic radiation, radiation from visible and infra-red regions of the electro magnetic spectrum and other forms of corpuscular and; or wave-like energy generally deemed to be radiant energy. For radiographic and short wave UV exposure and for all exposure sources other than charged particle beams such as electron and ion beams, the conductive layer in the above imaging film may be eliminated and the image-receptive crystals in the binder may be disposed directly on the substrate material; although absence of the conductive layer may permit the film to become so charged that a beam of electrons or ions employed for imaging may be somewhat distorted. However, since the preferred source for the high dosage level exposure is an electron or ion beam, it follows that the use of a conductive layer, to limit distortion of the image resulting from film charging, is preferred.

The preferred source of exposure employed in the present invention is an electron beam. Generally the electrons, under high vacuum, between about $10^{-3}$ and about $10^{-9}$ torr, preferably between about $10^{-5}$ and about $10^{-8}$ torr, bombard the surface of the film, thus transmitting an image thereon for colored development into an optical display. The techniques of electron beam recording are well known, thus further amplification is not required. However, for illustrative purposes, a typical conventional electron beam recording operation suitable for the present invention may utilize an electron beam characterized by having a beam diameter of from about 1 to 100 micrometers, an energy of from about 10 to 30 KeV, a current flow of from about $10^{-9}$ to $10^{-5}$ amps and adapted to scan a target area at a rate such that the dwell time is from about $10^{-8}$ to $10^{-3}$ seconds Vacuum pressures in the film chamber commonly range from about $10^{-3}$ to $10^{-8}$ torr.

Generally, the exposure at the low dosage level can be effected by any radiant source including photons, UV light, X-rays, gamma ray, beta rays, an ion beam, a molecular beam of uncharged particles, and an electron beam. The low dosage level exposure is usually carried out at between about $10^{-10}$ C/cm$^2$ and about $10^{-5}$ C/cm$^2$, preferably between about $10^{-9}$ C/cm$^2$ and about $10^{-6}$ C/cm$^2$, for electron beam exposure or the equivalent dosage for other sources of radiation. The high dosage level exposure is effected by a particulate radiation source, such as that generated by an ion beam, a molecular beam of uncharged particles or an electron beam. The high dosage level is usually at an exposure of between about $10^{-5}$ C/cm$^2$ and about $10^{-1}$ C/cm$^2$, preferably between about $10^{-4}$ C/cm$^2$ and about $10^{-2}$ C/cm$^2$, for the electron beam or the equivalent dosage for other sources of particulate energy radiation.

For the purposes of the present invention, the image receptive layer is usually the surface layer of the imaging film and may comprise polyacetylenic microcrystals fixedly suspended and uniformly distributed in a binder material. However, a protective layer can be applied over the polyacetylene containing surface layer, e.g. to prevent damage due to abrasion. Liquid dispersion of normally crystalline polyacetylenic compounds may or may not be aged before drying and imaging according to the process disclosed in my copending patent application, Ser. No. 773,487, filed Sept. 9, 1985. In general, the image receptive polyacetylenic compounds of this invention are any of those described in U.S. Pat. No. 3,501,302 and are capable of bicolor development. However, the preferred polyacetylenic compounds are the conjugated diynes, particularly hydrocarbon or acid diynes containing from 20 to 30 carbon atoms. A general formula for these preferred acetylenic compounds is represented by the structure A—(CH$_2$)$_n$—C≡C—C≡C—(CH$_2$)$_m$—B wherein m and n are both independently an integer of from 6 to 14 and A and B are independently methyl or carboxyl groups. Specific examples of such polyacetylenes include pentacosa-10,12-diynoic acid; 13,15-octacosadiyne and docosa-10,12-diyne-1,22-dioic acid. Of these, pentacosa-10,12-diynoic acid is most preferred since it provides unusually high sensitivity to electron beam exposure. It is to be understood however, that dispersions of other color developing polyacetylenes having a conjugated structure can be employed alone or in admixture with the preferred diynes as the image receptive layer of the present invention. Such compounds include the diynes of the above structure wherein the A and/or B moieties, in addition to lower alkyl or carboxyl, also can be hydroxy, amido, lower alkyl substituted amido, an aliphatic or aromatic carboxylate ester group having up to 10 carbon atoms, a mono- or di- valent carboxylate metal salt group, halo, carbamyl, lower alkyl substituted carbamyl or tosyl, as well as the corresponding triyne and tetrayne products of the above polyacetylenes having from 20 to 60 carbon atoms and a conjugated structure. Examples of these compounds include 10,12-docosadiynediol, the ditoluene-p-sulfonate of 9,11-eicosadiynoic acid, the monoethyl ester of 10,12-docosadiynedioic acid, the sodium or potassium salt of 10,12-pentacosadiynoic acid, 10,12-docosadiyne chloride, 10,12-pentacosadiyne (m-tolylurethane), 10,12-pentacosadiyne {[(butoxylcarbonyl)-methyl]urethane}, N-(dimethyl)-10,12-pentacosadiynamide, N,N'-bis($\alpha$-methylbenzyl) 10,12-pentacosadiyndiamide, triaconta-16,18,20-triynoic acid, etc.

In the preparation of these films, the polyacetylenic crystals may first be dispersed in a non-solvating liquid binder of plastic, resin, colloid or gel and coated on a suitable conductive substrate to a layer thickness of from about 0.25 to about 500 micrometers. On drying the dispersion, crystals become fixedly positioned in the binder. The drying operation is conducted over a period of from about 20 seconds to about 10 hours at from about ambient temperature up to about 100° C. and is preferably effected at 15° C. to 60° C. for a period from about 1 minute to about 5 hours.

Exemplary binder materials include natural and synthetic plastics, resins, waxes, colloids, gels and the like including gelatins, desirably photographic-grade gelatin, various polysaccharides including dextran, dextrin, hydrophilic cellulose ethers and esters, acetylated starches, natural and synthetic waxes including paraffin, beeswax, polyvinyl-lactams, polymers of acrylic and methacrylic esters and amides, hydrolyzed interpolymers of vinyl acetate and unsaturated addition polymerizable compounds such as maleic anhydride, acrylic and methacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone, polyvinyl acetals including polyvinyl acetaldehyde acetal, polyvinyl butyraldehyde acetal, polyvinyl sodium-o-sulfobenzaldehyde acetal, polyvinyl formaldehyde acetal, and numerous other known photographic binder materials including a substantial number of aforelisted useful plastic and resinous substrate materials which are capable of being placed in the form of a dope, solution, dispersion, gel, or the like for incorporation therein of the photosensitive polyacetylenic composition and then capable of processing to a solid form containing dispersed crystals of the photosensitive crystalline polyacetylenic composition of matter. As is well known in the art in the preparation of smooth uniform continuous coatings of binder materials, there may be employed therewith small amounts of conventional coating aids as viscosity controlling agents, surface active agents, leveling agents, dispersing agents, and the like. The particular binder material employed is selected with due regard to the specific radiant energy and technique to be employed in the particular image-recording application and invariably is a binder material permitting substantial transmission or penetration of that specific radiant energy to be employed.

Because the crystal size of commercially available, normally crystalline polyacetylenes is relatively large and of varying dimension and since for the coatings of the present invention a microcrystalline size, between about 0.01 and about 5 micrometers, preferably between about 0.05 and about 0.2 micrometers, is most desirable, it is generally recommended that the commercial polyacetylene be first dissolved in a solvent from which it can subsequently be recrystallized as fine discrete crystals of a more uniform size, as set forth in said copending patent application FDN-1450.

Alternatively, the polyacetylenic compound of the invention can be disposed as a 2-dimensional ordered phase surface layer on the substrate. Polyacetylenes containing at least one hydrophobic group and at least one hydrophilic group are particularly adapted to the preparation of ordered 2-dimensional phases and include the conjugated diynes, triynes and tetraynes of the polyacetylene series having from 20 to 60 carbon atoms Preferred of these polyacetylenes are the diynes of the above formula having from 20 to 40 carbon atoms wherein either A or B is a hydrophobic group such as linear, branched chain or cyclic alkyl radicals of from 1 to 12 carbon atoms or aryl of from 6 to 9 carbon atoms and the remaining substituent of A or B is a hydrophilic group such as a sulfonic acid, phosphonate, sulfonate, carboxylate, primary amino, primary amido, carboxyl or hydroxy group. Examples of these include
1-phenyl-10,12-docosadiyne-22-ol,
(4-methyl)-16,18-triacontadiyne amide,
1-tolyl-11,13-tetracosadiyne sulfonic acid and
1-cyclobutyl-16,18-octatriacontadiyne phosphonate Such 2-dimensional ordered phase coatings can be prepared by the Langmiur-Blodgett method, which involves dissolving the polyacetylenic compound in a water immiscible, relatively low boiling solvent and spreading the resulting solution as a film on an aqueous surface, preferably a water surface, at the water air interface. The solvent is then evaporated and a layer of molecules of the polyacetylene compound on the aqueous surface remains. The layer of molecules is then compressed to a surface pressure consistent with the formation of a monomolecular layer of the polyacetylenic compound at the water/air interface and conducive to transfer of the monomolecular film to a solid substrate by passing the substrate through the surface. The dipping procedure is repeated as desired to build-up additional monomolecular layers of polyacetylenic film to a desired thickness of up to about 10 micrometers on the substrate.

For the purposes of the present invention, it is preferred to employ a multi-layered substrate for the polyacetylenic layer of the imaging medium. When such an imaging medium is employed, it essentially contains a separate conductive layer underlying the polyacetylene imaging layer and may also contain separate support and adhesive layers. However, in certain applications, where the polyacetylene binder has sufficient integrity at exposure temperatures, the imaging film may consist solely of crystals suspended in the binder which forms a single layer base film as the imaging medium.

A typical film for the purpose of the present invention comprises microcrystalline polyacetylene in a nonsolvating binder or a multilayered 2-dimensional ordered phase of the polyacetylene to form a layer of from about 0.25 to about 500 micrometers, preferably from about 2 to about 10 micrometers, thickness which overlays a substrate of from about 0.5 mil to about 10 mils thickness.

Supports suitable for the purposes of the present invention include any of those commercially available and generally include an electrically conductive layer of between about 0.001 micrometer and about 0.25 micrometer thickness, preferably 0.01 micrometer and about 0.05 micrometer thickness.

Although transparent conductive layers of up to about 0.05 micrometer are most preferred, opaque conductive layers of up to 5 micrometers can also be employed when need arises. The conductive layer limits the capacitance of the charge accepting layer, namely the image-receptive polyacetylenic crystals dispersed in binder or the multilayered 2-dimensional ordered film Of the polyacetylenic compound, and typically has a resistivity of $10^6$ ohms/square or less and preferably $10^4$ ohms/square or less. The conductive material is an electrically conductive metal, metal oxide, metal alloy, metal halide or carbon black which metal, metal compound and carbon black components may or may not be suspended in a dispersion medium such as gelatin, dextran, a cellulose ether or ester or any other conventional suspension medium. Suitable metals include gold, silver, platinum, copper, iron, tin, aluminum, indium, nickel, palladium, rhodium and mixtures of these as may occur in alloys and metal oxides or halides. A specific metal oxide which may be suitably employed includes indium-tin oxide. Silver bromide and copper iodide are representative of the metal halides which may be used as the conductive layer. Of these conductive materials, indium-tin oxide is most preferred.

Where desired, the polyacetylenic layer may be more firmly affixed to the conductive layer by means of a thin adhesive layer having a thickness of between about 0.1 micrometer and 1.5 micrometers. When used, suitable adhesives include acrylate based polymers and copolymers, particularly those containing carboxylate moieties such as acrylic acid or methacrylic acid residues and mixtures of these polymers or copolymers with gelatin.

In certain cases, when a conductive metal sheet is employed as the substrate, a separate conductive layer may be eliminated and the image-receptive layer disposed directly on the metal sheet conductive support.

The conductive layer is usually supported by a substrate of between about 0.25 and about 100 mils, preferably 0.5 to 10 mils, thickness. Suitable materials employed as substrates include polyester, polyethylene terephthalate, glass, clay-sized paper, fiberboard, metal sheeting, glazed ceramic, cellulose acetate, polystyrene, polycarbonates or any other conventional support.

The substrate or support can be flexible or rigid, opaque or transparent depending on the final use of the film. Particularly, preferred are the commercial polyester substrates such as MYLAR (polyethylene terephthalate), supplied by E. I. duPont Corporation and HOSTAPAN supplied by American Hoechst.

Having generally described the invention, reference is now had to the examples which describe preferred embodiments thereof, but which are not to be construed as limiting to the scope of the invention as more broadly set forth above and in the appended claims.

EXAMPLE 1

Preparation of an Image Receptive Film Having Fixedly Suspended Uniformly Distributed Polyacetylenic Crystals as A Surface Layer In a glass beaker, 15 g of pentacosa-10,12-diynoic acid was dissolved at 38° C. in 45 g of ethyl acetate to form a solution, Solution A. A second solution, Solution B, was prepared by dissolving 15 g of photographic gelatin in 250 g of water and 30 ml of an aqueous solution containing 3% by weight of surfactant GAFAC-RS-710[1]. Solution B was heated to 40° C. and introduced into a 1 quart size Waring blender. While blending at high speed, Solution A was added to Solution B over about a 30 second period. Blending was continued for an additional 2.5 minutes before pouring onto a stainless steel tray where it was allowed to chill set. The gelled dispersion was cut into approximately 1 cm cubes and allowed to sit in an airstream to remove ethyl acetate by evaporation. After the ethyl acetate had been removed, the gelled dispersion was reconstituted by melting at 40° C. and adding sufficient water to replace the weight loss that occurred during drying. The average crystal size was between about 0.05 micrometer and about 0.22 micrometer. The reconstituted dispersion was then frozen at about −15° C. for a period of 2 hours and allowed to warm to room temperature after which it was melted and coated at about 10 micrometers thickness on a 4 mil film base, SIERRACIN INTREX-K [2]; a polyester base carrying an indium-tin oxide conductive coating, having a resistivity of about $10^3$ ohms/square, which had been overcoated with a 1 micrometer thick layer of an adhesion promoting material composed of about 50 wt. % gelatin and 50 wt % of a latex polymer. The coated film was then allowed to dry in air at ambient temperature.

[1] an acid phosphate ester of nonyl phenol supplied by GAF Corporation
[2] supplied by Sylmar/Sierracin Company

EXAMPLE 2

The imaging film prepared in Example 1 was then placed in the specimen holder of an electron beam recording apparatus and a beam of 20 KeV electrons was employed to expose a pattern of a graph with superimposed curve. The graph portion was transmitted to the specimen surface layer by a $10^{-7}$ C/cm$^2$ exposure for a dwell time of 5 seconds after which an intense blue image of the graph was immediately developed on the film. The curve portion of the image was then transmitted to the specimen surface layer by a $10^{-4}$ C/cm$^2$ exposure for a dwell time of 60 second whereupon a curve in an orange-yellow hue was superimposed over the graph. The resolution of the transmitted image in blue and yellow hues was exceedingly high.

EXAMPLE 3

Preparation of an Image Receptive Film Having Multilayers of a Hydrophobic-Hydrophilic Polyacetylenic Monomolecular Film in a 2-Dimensional Ordered Phase Disposed on a Conductive Substrate Solution C was made by dissolving 1 g of pentacosa-10,12-diynoic acid in carbon tetrachloride and 0.125 ml of this solution were applied to the surface of water contained in a Langmiur-Blodgett film balance. After allowing 5 minutes for the carbon tetrachloride to evaporate, the surface film of molecules of pentacosa-10,12-diynoic acid was compressed, by driving a movable barrier across the surface of the water, to a surface pressure of about 20 dynes/cm$^2$. A 1 inch square, chromium coated glass slide was driven perpendicularly through the monomolecular film at the air-water interface at the rate of 1 mm/sec while maintaining a surface pressure of about 20 dynes/cm$^2$ by means of the movable barrier. Transport of the substratee through the interface causes a monomolecular layer of pentacosa-10,12-diynoic acid to be transferred to the surface of the substrate. The thickness of a single monomolecular layer is about 25 Å. A multitude of such layers was built up by repeatedly passing the substrate through the water-air interface, a total of about 400 layers being required to produce a final thickness of a pentacosa-10,12-diynoic acid layer of about 1 micrometer. From time to time, the monomolecular film of pentacosa-10,12-diynoic acid at the water/air interface was replenished by releasing the movable barrier and applying the requisite amount of solution C to make up for the pentacosa-10,12-diynoic acid that had been transferred to the surface of the substrate.

EXAMPLE 4

The multilayered monomolecular film sample prepared in Example 3 was placed in the holder of an electron beam recording apparatus and a 15 KeV beam of electrons was employed to expose an alphabet in lower case and upper case letters. The upper case letters were transcribed at an exposure of about $10^{-7}$ C/cm$^2$ and an intense blue image of the characters was immediately developed. The lower case letters were transcribed at an exposure dosage of about $10^{-3}$ C/cm$^2$ and were developed in an orange-yellow hue clearly distinguishable from the blue color of the upper case letters.

EXAMPLE 5

Example 1 was repeated and a sample of the film was placed such that the recording layer was in contact with a stencil cut in the pattern of a grid. The pattern of the grid was transferred to the film by illuminating the stencil with ultraviolet light substantially containing radiation at a wavelength of 254 mm and below. Since the stencil, except where patterned, is opaque to radiation of this energy, a blue image of the grid is immediately formed on the film without the necessity for processing. The imaged film sample was then registered in the sample holder of an electron beam recording apparatus and the axes of the grid were labelled by exposing the film to a source of 15 KeV electrons at a dosage of about $2 \times 10^{-4}$ C/cm$^2$. The labelling image so formed was of an orange-red hue and clearly distinguishable from the blue color of the grid.

It will be understood that many modifications and alterations in the foregoing examples will become apparent from the disclosure. For example, in any of Examples 2, 4 and 5, the exposure dosage can be reversed such that the high dosage level exposure developing its characteristic color can be effected before the lower dosage level exposure. Also, any of the other charged particle beam sources can be substituted in the examples for the electron beam source when employed at dosage levels equivalent in effect to the electron beam dosage levels recited above. Similarly, any of the other energy sources such as X-rays, gamma rays, beta rays or UV light can be substituted in Examples 2, 4 and 5 for the low level exposure dosage when employed at dosage levels equivalent in effect to the elctron beam dosage levels recited above.

It is also within the scope of this invention to employ a recording film comprising a conductive material supporting a plurality of individual and superimposed polyacetylene imaging layers, each preferably containing a dissimilar polyacetylenic compound capable of distinguishable hue or color development and to image said polyacetylene imaging layers employing separate and distinct beam energies, each modulated to penetrate the individual imaging layers. Particularly desired is such a recording film having two separate superimposed imaging layers, each containing different polyacetylene compounds, which are developed individually to display portions of the transmitted information in a plurality of distinguishable colors. In this case a somewhat lower beam energy within the above range, e.g. 10–15 KeV, is used for the surface imaging layer and a somewhat higher beam energy within the disclosed range, e.g. 20–30 KeV, is employed for the second underlying imaging layer. It is to be understood that the beam energy utilized increases with each underlying imaging layer. In this way, the net exposure of the film is minimized. In a broad sense, a plurality of superimposed layers, each containing a distinctive photosensitive polyacetylenic compound, may be regarded as forming a composite surface layer of the recording film.

These and many more modifications which become evident from the foregoing disclosure are also included within the scope of this invention.

What is claimed is:

1. The process of subjecting an image receptive film having a surface layer of a photosensitive polyacetylenic compound to a plurality of separate radiant energy exposures at distinctive dosage intensity levels the exposure at higher intensity being effected with a particulate source of irradiation, each exposure at said distinctive dosage intensity level being limited to a divisible portion of the overall image to be transmitted, so as to develop exposed discrete portions of the image in the corresponding divided portion po a color distinguishable from the color of any other exposed portion resulting from another exposure at a dissimilar dosage intensity level in said surface layer.

2. The process of claim 1 wherein the surface layer of the image receptive film is a layer of uniformly distributed, fixedly positioned suspension of polyacetylenic crystals.

3. The process of claim 2 wherein the surface layer of said image receptive film is a layer of diacetylenic crystals having the formula $A-(CH_2)_n-C{\equiv}C-C{\equiv}C-(CH_2)_m-B$ wherein m and n are both independently an integer of from 6 to 14 and A and B are independently lower alkyl, carboxyl, hydroxy, amido, lower alkyl substituted amido, an aliphatic or aromatic carboxylate ester group having up to 10 carbon atoms, a mono- or di- valent carboxylate metal salt group, halo, carbamyl, lower alkyl substituted carbamyl or tosyl 4. The process of claim 3 wherein the surface layer of said image receptive film is a layer of pentacosa-10,12-diynoic acid crystals suspended in gelatin, said layer having a thickness of between about 0.25 and about 500 micrometers.

5. The process of claim 1 wherein the surface layer of the image receptive film is a plurality of monomolecular, 2-dimensional ordered phase films of a photosensitive polyacetylenic compound.

6. The process of claim 5 wherein the polyacetylenic compound contains at least one hydrophobic group and at least one hydrophilic group.

7. The process of claim 6 wherein the polyacetylenic compound is pentacosa-10,12-diynoic acid.

8. The process of claim 1 wherein said imaging film is subjected to a plurality of 10–30 KeV electron beam exposures, at least one exposure being at a dosage level of between about $10^{-10}$ and about $10^{-5}$ C/cm$^2$ and at least one other exposure being at a higher dosage intensity level of between about $10^{-5}$ and about $10^{-1}$ C/cm$^2$ to produce a polychromic image of exposed portions of the said image receptive film distinguishable from unexposed crystals.

9. The process of claim 8 wherein the low dosage level exposure is effected before the higher dosage level exposure.

10. The process of claim 8 wherein the high dosage level exposure is effected before the lower dosage level exposure.

11. The process of claim 8 wherein said imaging film is exposed to two 10–30 KeV electron beam exposures, one exposure being at a dosage intensity level between about $10^{-9}$ and about $10^{-6}$ C/cm$^2$ and the remaining exposure being at a dosage intensity level between about $10^{-4}$ and about $10^{-2}$ C/cm$^2$.

12. The process of claim 1 wherein the image receptive film is subjected to a low dosage intensity level exposure and a higher dosage intensity level exposure and wherein the low dosage intensity level exposure is effected by UV light and the higher dosage intensity level exposure is effected with an electron beam.

13. The process of claim 1 wherein the image receptive film is subjected to a low dosage intensity level exposure and a higher dosage intensity level exposure and wherein the low dosage intensity level exposure is effected with X-rays and the higher dosage intensity level exposure is effected with an electron beam.

14. The process of claim 1 wherein the image receptive film is subjected to a low dosage intensity level exposure and a higher dosage intensity level exposure and wherein both the low dosage intensity level exposure and the higher dosage level exposure are effected with an electron beam.

15. The process of claim 1 wherein said surface layer of said film is protected with an abrasion resistant coating.

16. The process of claim 1 wherein the surface layer of said film containing a photosensitive polyacetylenic compound is superimposed over another layer containing a dissimilar photosensitive polyacetylenic compound and wherein the layers containing the photosensitive polyacetylenic compounds are individually subjected to distinctive beam energy exposures, such that the surface layer is exposed at a lower beam energy than any layer over which it is superimposed.

* * * * *